(12) United States Patent
Kawamura

(10) Patent No.: US 6,356,157 B1
(45) Date of Patent: Mar. 12, 2002

(54) PHASE LOCKED LOOP CIRCUIT

(75) Inventor: Yukio Kawamura, Miyazaki (JP)

(73) Assignee: Oki Electric Industry, Co., Ltd. (JP)

( * ) Notice: Subject to any disclaimer, the term of this patent is extended or adjusted under 35 U.S.C. 154(b) by 0 days.

(21) Appl. No.: 09/494,182

(22) Filed: Jan. 31, 2000

(30) Foreign Application Priority Data

Aug. 11, 1999 (JP) .......................................... 11-227520

(51) Int. Cl.[7] ................................................. H03L 7/00
(52) U.S. Cl. ........................... 331/11; 331/10; 327/148; 327/157
(58) Field of Search ................................. 327/148, 157, 327/156, 147; 331/10, 11, 25

(56) References Cited

U.S. PATENT DOCUMENTS

| | | | | |
|---|---|---|---|---|
| 5,487,093 A | * | 1/1996 | Adresen et al. | ................ 331/11 |
| 6,118,346 A | * | 9/2000 | Olgaard | ........................ 331/17 |
| 6,130,565 A | * | 10/2000 | Nagano et al. | ............. 327/157 |
| 6,160,432 A | * | 12/2000 | Rhee et al. | ................. 327/157 |

* cited by examiner

Primary Examiner—Tuan T. Lam
(74) Attorney, Agent, or Firm—Venable; James R. Burdett

(57) ABSTRACT

The Phase Locked Loop circuit of this invention has both a short locking time and a stable operation. This Phase Locked Loop circuit has two phase comparators. The inputs to these two comparators are a reference signal $V_f$ and a feedback signal $V_c$. The first phase comparator has two separate outputs depending on the phase difference $\delta$ between the signals $V_f$ and $V_c$. The first output is a signal up1 when $\delta$ is smaller than $-\tau 1$, and the second output is a signal dn1 when $\delta$ is larger than $-\tau 1$. The second phase comparator also has two outputs depending on the phase difference $\delta$ between the signals $V_f$ and $V_c$. The first output is a signal up2 when $\delta$ is smaller than $-\tau 2$ ($\tau 2 > \tau 1$), and the second output is a signal dn2 when $\delta$ is larger than $\tau 2$. The signals up1 and up2 are output when the $\delta$ has positive polarity and large absolute value. When $\delta$ has positive polarity and a small absolute value, only signal up1 is output. Signals dn1 and dn2 are output when $\delta$ has negative polarity and large absolute value. When $\delta$ has negative polarity and a small absolute value, only signal dn1 is output. The voltage control oscillator outputs an oscillation signal $V_o$. The frequency of the signal $V_o$ rises or falls in accordance with the polarity of $\delta$. Additionally, the frequency of the signal $V_o$ is controlled in accordance with the absolute value of the phase difference $\delta$.

21 Claims, 10 Drawing Sheets

FIG.5

| | up1 | up2 | dn1 | dn2 |
|---|---|---|---|---|
| $\delta \leqq -\tau 2$ | L | L | H | H |
| $-\tau 2 < \delta \leqq -\tau 1$ | L | L | H | L |
| $-\tau 1 < \delta < \tau 1$ | L | L | L | L |
| $\tau 1 \leqq \delta < \tau 2$ | H | L | L | L |
| $\tau 2 \leqq \delta$ | H | H | L | L |

H ; High Level
L ; Low Level

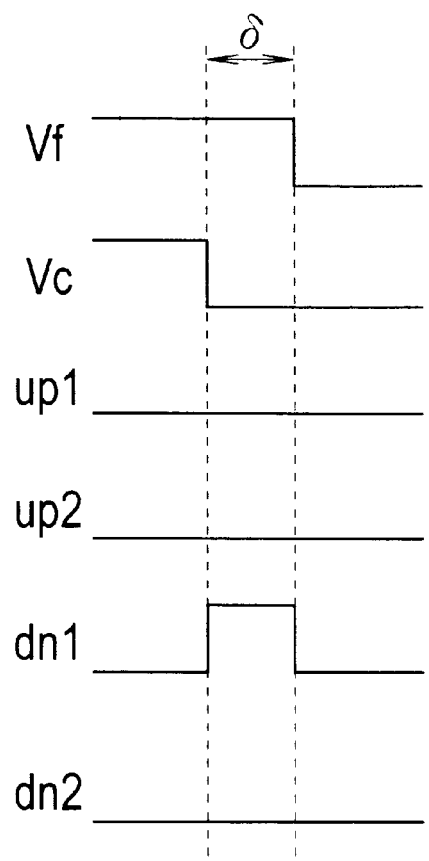 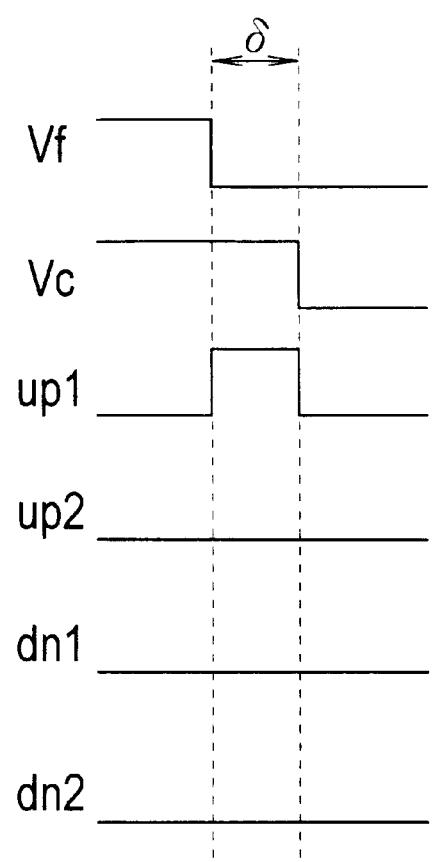

PHASE LOCKED LOOP CIRCUIT

BACKGROUND OF THE INVENTION

1. Field of the Invention

The present invention relates to a PLL (Phase Locked Loop) circuit. A PLL circuit is utilized as a reference clock generating circuit in a CPU (Central Processing Unit), and as a tuning circuit in a cellular telephone, among other things.

2. Description of Related Art

A PLL circuit is one that follows the frequency of a reference signal inputted from outside.

A PLL circuit uses a reference signal to generate an oscillation signal, and outputs this oscillation signal. Furthermore, a PLL circuit also compares this oscillation signal against the reference signal, and changes the frequency of the oscillation signal so that the phases of the two signals approximate one another. By and by, the frequency of the oscillation signal is made identical to the frequency of the reference signal. The state, wherein the frequencies of both signals are identical is referred to as a locked state. The time required from the start of comparing an output signal against a reference signal until a locked state is achieved is referred to as locking time.

When used as a tuning circuit or the like, it is desirable that the locking time of a PLL circuit be as short as possible. The shorter the locking time, the more rapidly a PLL circuit can imitate the frequency changes of a reference signal. To shorten locking time, the time constant of a PLL circuit can be made smaller. As is commonly known, a time constant $\tau$ is defined by $\tau = RC$, wherein R is resistance, and C is capacitance. To make the time constant of a PLL circuit smaller, for example, the resistance value of the filter inside the PLL circuit can be made smaller.

However, when the time constant of a PLL circuit is made smaller, the stability of operation of the PLL circuit is lost. For example, if the time constant is too small, there are cases, wherein the frequency of an oscillation signal is fixed in a state, in which same deviates round the frequency of a reference signal, and fails to converge with the reference signal frequency.

SUMMARY OF THE INVENTION

An object of the present invention is to provide a PLL circuit, wherein locking time is short, and operation is stable.

To achieve this object, a PLL circuit related to the present invention comprises means for detecting a phase difference between a reference signal and a feedback signal; means for supplying either a positive current or a negative current in accordance with a polarity of a phase difference, while making internal impedance smaller when the absolute value of a phase difference is large, and making internal impedance larger when the absolute value of a phase difference is small; means for outputting a control voltage signal, which changes in accordance with the supply quantity of a positive current and a negative current; and means for generating a frequency signal as an oscillation signal and a feedback signal, whose frequency is controlled using a control voltage signal.

Changing the impedance of a supply means in accordance with the absolute value of a phase difference between a reference signal and a feedback signal makes it possible to change the time constant of a PLL circuit in accordance with the absolute value of the phase difference thereof. A PLL circuit of the present invention operates at a small time constant when the absolute value of a phase difference is large, and operates at a large time constant when the absolute value of a phase difference is small. Therefore, a PLL circuit of the present invention achieves short locking time, and stable operation.

BRIEF DESCRIPTION OF THE DRAWINGS

The foregoing and other objects, features and advantages of the present invention will be better understood from the following description taken in connection with the accompanying drawings, in which:

FIG. 5 is a table for explaining the operation of the PLL circuit shown in FIG. 1;

FIG. 6A, FIG. 6B, FIG. 6C and FIG. 6D are timing charts for explaining the operation of the PLL circuit shown in FIG. 1;

DESCRIPTION OF THE PREFERRED EMBODIMENTS

Embodiments of the present invention will be explained hereinbelow by using the figures. In the figures, the size, shape and arrangement relationship of each component element are schematically shown to the extent necessary to be able to understand the present invention, and the numerical conditions that will be explained hereinbelow are simply given as examples.

Figure 1:
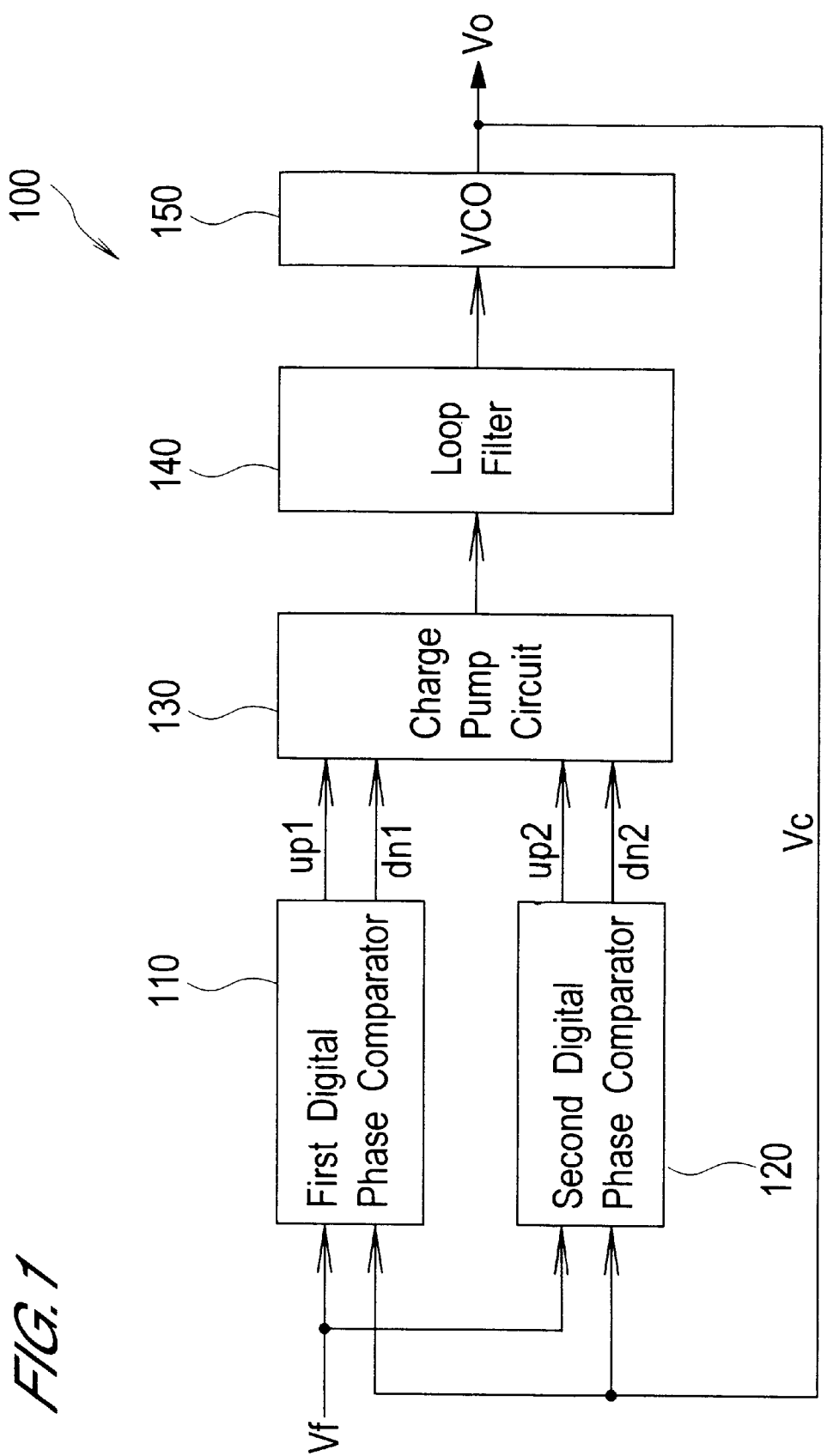
FIG. 1 is a block diagram showing the constitution of a PLL circuit related to an embodiment of the present invention.

As shown in FIG. 1, a PLL circuit 100 related to this embodiment comprises two digital phase comparators 110, 120, a charge pump circuit 130, a loop filter 140, and a VCO (Voltage Control Oscillator) 150.

A first digital phase comparator 110 inputs a reference signal Vf and a feedback signal Vc, and compares the phase of the feedback signal Vc against the phase of the reference signal Vf. And the phase comparator 110 outputs a charge-up signal up1 as a signal, which indicates the phase of signal Vc is leading, and outputs a charge-down signal dn1 as a signal, which indicates the phase of signal Vc is lagging. When the phase of the feedback signal Vc leads the phase of the reference signal Vf by more than a prescribed value $\tau 1$, a charge-up signal up1 becomes high level, and a charge-down signal dn1 becomes low level. When the phase of the feedback signal Vc lags behind the phase of the reference signal Vf by more than a prescribed value $\tau 1$, a charge-up signal up1 becomes low level, and a charge-down signal dn1 becomes high level When the phase difference $\delta$ of the two signals Vf, Vc is within the dead zone, the phase comparator 110 sets both signals up1, dn1 to low level. The dead zone of the phase comparator 110 is expressed by $-\tau1<\delta<\tau1$ ($\tau1\geq0$). That is, the phase comparator 110 sets only signal up1 to high level when the phase difference δ of signals Vf, Vc is $\delta>\tau1$, sets signals up1, dn1 to low level when $\tau1>\delta>-\tau1$, and sets only signal dn1 to high level when $-\tau1\geq\delta$.

A second digital phase comparator 120 inputs a reference signal Vf and a feedback signal Vc, and compares the phase of the feedback signal Vc against the phase of the reference signal Vf. And, the phase comparator 120 outputs a charge-up signal up2 as a signal, which indicates the phase of signal Vc is leading, and outputs a charge-down signal dn2 as a signal, which indicates the phase of signal Vc is lagging. The dead zone of the phase comparator 120 is expressed by $-\tau2<\delta<\tau2$ ($\tau2>0$). The phase comparator 120 is constituted so that the width of the dead zone thereof is wider than that of the phase comparator 110. That is, in this embodiment, a value τ2, which stipulates the dead zone, is selected so that $\tau2>\tau1$. When the phase of the feedback signal Vc leads the phase of the reference signal Vf by more than a prescribed value τ2, that is, when $\delta\geq\tau2$, signal up2 becomes high level. When the phase of the feedback signal Vc lags behind the phase of the reference signal Vf by more than a prescribed value τ2, that is, when $-\tau2\geq\delta$, signal dn2 becomes high level. When the phase difference δ of the two signals Vf, Vc is within the dead zone, that is, when $-\tau2<\delta<\tau2$ ($\tau2>0$), signals up2, dn2 both become low level.

A charge pump circuit 130 inputs charge-up signals up1, up2 and charge-down signals dn1, dn2 from a phase comparator 110, 120. The charge pump circuit 130 charges a capacitor (explained hereinbelow) inside a loop filter 140 when a charge-up signal is high level, and discharges this capacitor when a charge-down signal is high level. When a charge-up signal is high level, there are the case when only signal up1 is high level, and the case when both signals up1, up2 are high level. The charge pump circuit 130 increases the charging current of when signals up1, up2 are both high level more than the charging current of when only signal up1 is high level. Similarly, when a charge-down signal is high level, there are the case when only signal dn1 is high level, and the case when both signals dn1, dn2 are high level. The charge pump circuit 130 increases the discharging current of when signals dn1, dn2 are both high level more than the discharging current of when only signal dn1 is high level.

A loop filter 140 has a capacitor for storing electric charges. As explained above, this capacitor is charged and discharged by a charge pump circuit 130. The terminal-to-terminal voltage of the capacitor changes in accordance with these charging and discharging. That is, when the capacitor is charged, the terminal-to-terminal voltage rises, and when the capacitor is discharged, the terminal-to-terminal voltage drops. This terminal-to-terminal voltage is outputted to a VCO 150 as control voltage.

A VCO 150 inputs control voltage from the loop filter 140, and outputs an oscillation signal Vo. The frequency of the oscillation signal Vo becomes smaller when the control voltage rises, and becomes larger when the control voltage drops. The oscillation signal Vo is outputted to the outside of the PLL circuit 100 as an output signal, and is also inputted to the phase comparators 110, 120 as a feedback signal Vc. A self-running oscillation-type VCO, a non-self-running oscillation-type VCO, and other well-known VCO can be used as the VCO 150.

Figure 2A:
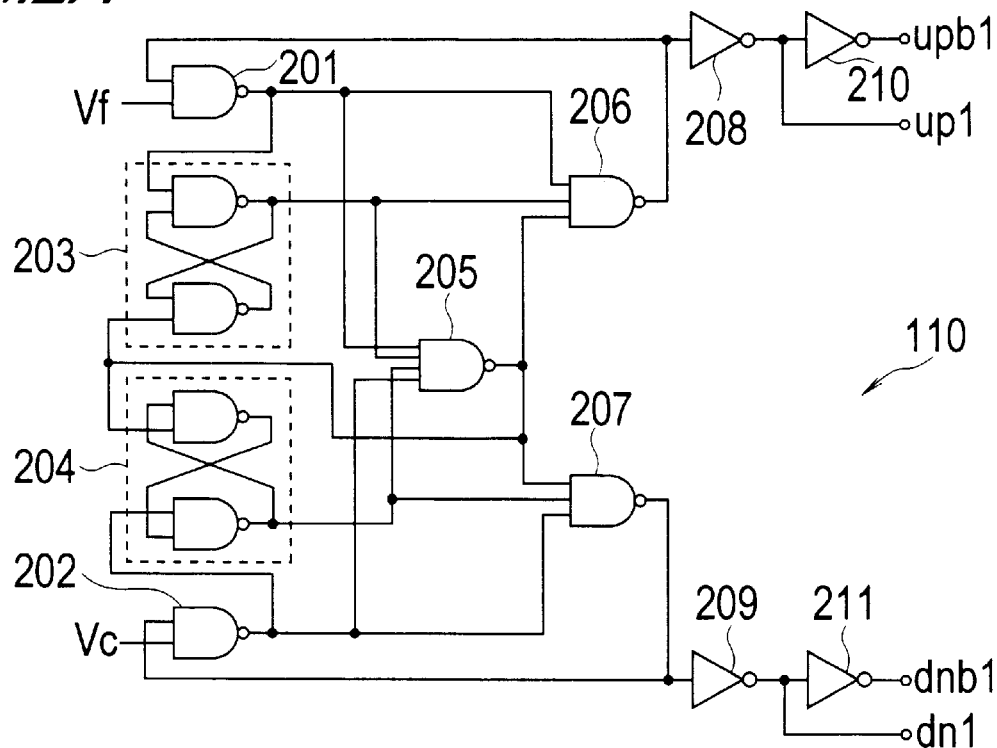
FIG. 2A and FIG. 2B are logic circuit diagrams showing examples of internal constitutions of the digital phase comparator shown in FIG. 1.

FIG. 2A is a logic circuit diagram showing an example of an internal constitution of the first digital phase comparator 110. As shown in FIG. 2A, this phase comparator 110 comprises 2-input NAND gates 201, 202, RS latches 203, 204, a 4-input NAND gate 205, 3-input NAND gates 206, 207, and inverters 208, 209, 210, 211.

NAND gate 201 inputs a reference signal Vf from one input terminal, and inputs an output signal of NAND gate 206 from the other input terminal. NAND gate 202 inputs a feedback signal Vc from one input terminal, and inputs an output signal of NAND gate 207 from the other input terminal. RS latch 203 inputs an output signal of NAND gate 201 from the S input terminal, and inputs an output signal of NAND gate 205 from the R input terminal. RS latch 204 inputs an output signal of NAND gate 202 from the S input terminal, and inputs an output signal of NAND gate 205 from the R input terminal. NAND gate 205 inputs output signals from NAND gates 201, 202, and RS latches 203, 204, respectively. NAND gate 206 inputs output signals of NAND gates 201, 205, and RS latch 203, respectively. NAND gate 207 inputs output signals of NAND gates 202, 205, and RS latch 204, respectively. Inverter 208 inputs an output signal of NAND gate 206, and outputs a charge-up signal up1. Inverter 209 inputs an output signal of NAND gate 207, and outputs a charge-down signal dn1. Inverter 210 inputs signal up1, and outputs an inverted signal upb1. Inverter 211 inputs signal dn1, and outputs an inverted signal dnb1. When inverted signals upb1, dnp1 are not used, inverters 210, 211 are not necessary.

Figure 2B:
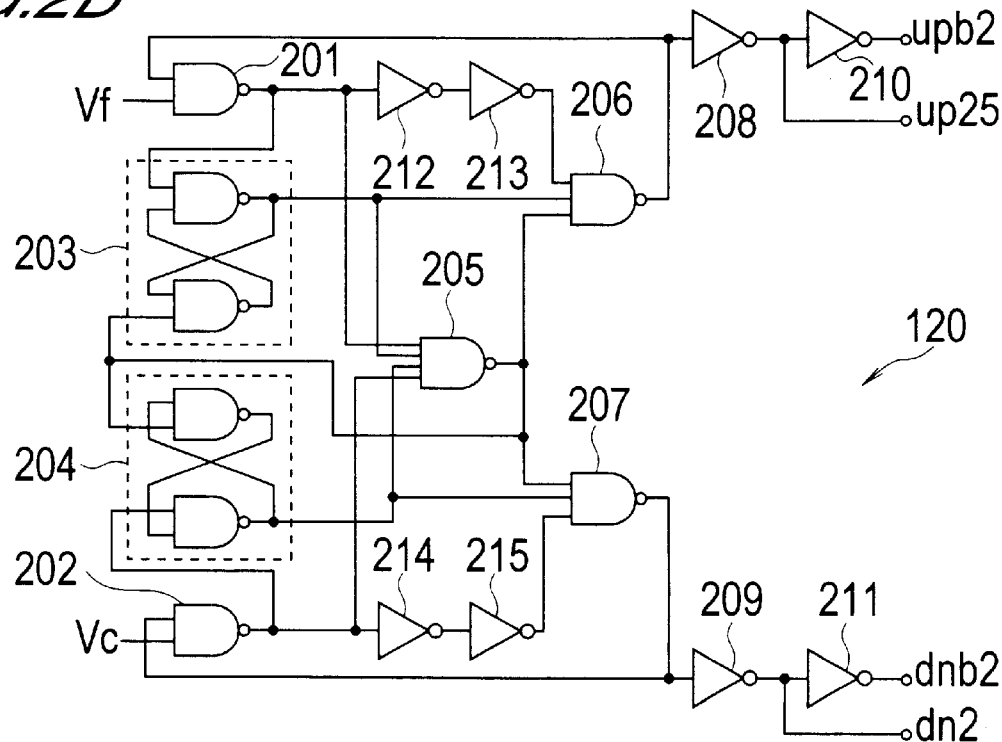

FIG. 2B is a logic circuit diagram showing an example of an internal constitution of the second digital phase comparator 120. In FIG. 2B, elements assigned the same part numbers as in FIG. 2A indicate the same elements as the case of FIG. 2A, respectively.

Phase comparator 120 differs from phase comparator 110 in that it comprises inverters 212, 213, 214, 215. An output signal of NAND gate 201 is inputted to NAND gate 206 by way of inverters 212, 213. Further, an output signal of NAND gate 202 is inputted to NAND gate 207 by way of inverters 214, 215. As will be explained hereinbelow, inverters 212, 213, 214, 215 are used as delay elements.

In FIG. 2B, inverter 208 outputs a charge-up signal up2, inverter 209 outputs a charge-down signal dn2, inverter 210 outputs an inverted signal upb2, and inverter 211 outputs an inverted signal dnb2, respectively. When inverted signals upb2, dnb2 are not used, inverters 210, 211 are not necessary.

Figure 3:
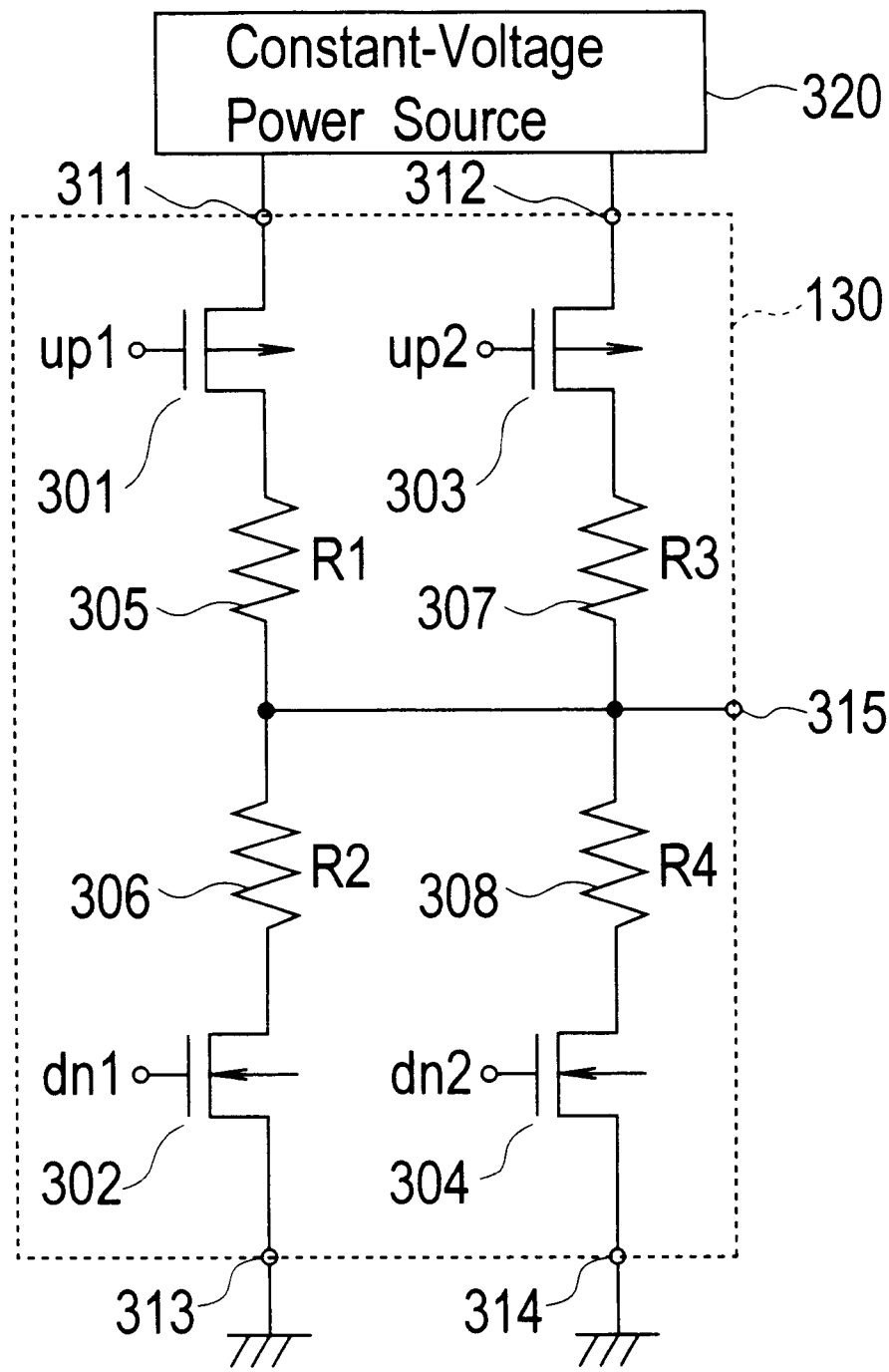
FIG. 3 is a circuit diagram showing an example of the internal constitution of the charge pump circuit shown in FIG. 1.

FIG. 3 is a circuit diagram showing an example of an internal constitution of the charge pump circuit 130.

As shown in FIG. 3, the charge pump circuit 130 comprises pMOS transistors 301, 303, nMOS transistors 302, 304, and resistors 305, 306, 307, 308. The resistance value of resistor 305 is R1, of resistor 306 is R2, of resistor 307 is R3, and of resistor 308 is R4.

In pMOS transistor 301, the gate inputs a charge-up signal up1, the source is connected to a constant-voltage power source 320 by way of a terminal 311, and the drain is connected to a current terminal 315 by way of a resistor 305.

In nMOS transistor 302, the gate inputs a charge-down signal dn1, the source is connected to a ground by way of a terminal 313, and the drain is connected to a current terminal 315 by way of a resistor 306.

In PMOS transistor 303, the gate inputs a charge-up signal up2, the source is connected to a constant-voltage power source 320 by way of a terminal 312, and the drain is connected to a current terminal 315 by way of a resistor 307.

In nMOS transistor 304, the gate inputs a charge-down signal dn2, the source is connected to a ground by way of a terminal 314, and the drain is connected to a current terminal 315 by way of a resistor 308.

The current terminal 315 either outputs drain current of pMOS transistors 301, 303, or inputs drain current of nMOS transistors 302, 304.

Figure 4A:
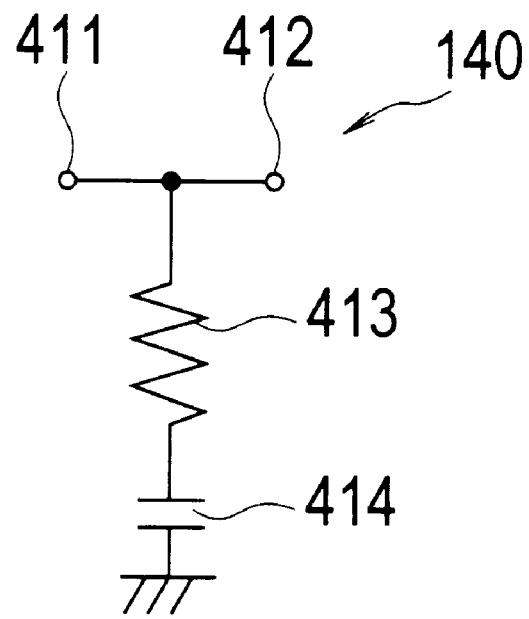
FIG. 4A and FIG. 4B are circuit diagrams showing examples of internal constitutions of the loop filter shown in FIG. 1.
Figure 4B:
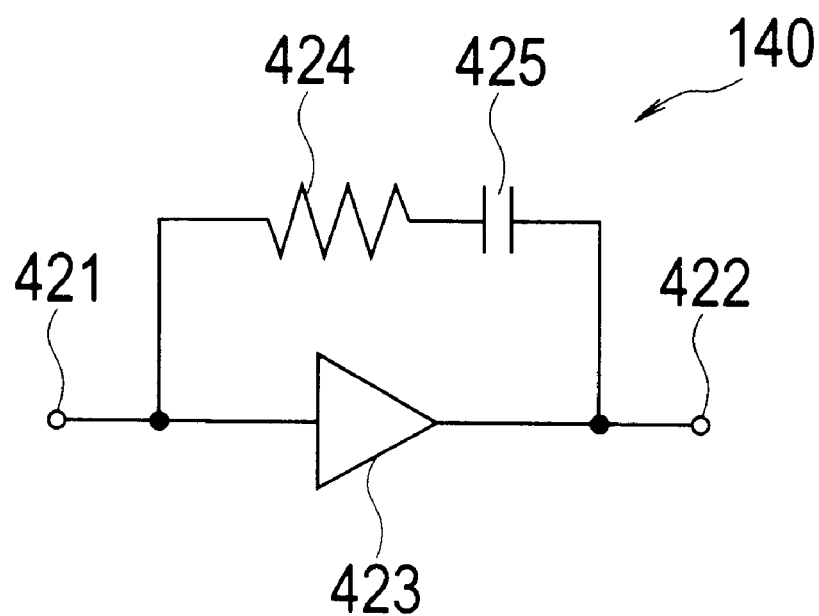

FIG. 4A and FIG. 4B are circuit diagrams showing examples of internal constitutions of the loop filter 140. FIG. 4A is an example, which uses a lag-lead filter, and FIG. 4B is an example, which uses an active filter.

The loop filter of FIG. 4A comprises a current terminal 411, a voltage terminal 412, a resistor 413, and a capacitor 414. The terminals 411, 412 are connected to the one end of the resistor 413. The other end of the resistor 413 is connected to the one end of the capacitor 414, and the other end of the capacitor 414 is connected to a ground.

The loop filter of FIG. 4B comprises a current terminal 421, a voltage terminal 422, an amplifier 423, a resistor 424, and a capacitor 425. In the amplifier 423, an input terminal is connected to the current terminal 421, and an output terminal is connected to the voltage terminal 422. One end of the resistor 424 is connected to the input terminal of the amplifier 423, the other end of the resistor 424 is connected to the one end of the capacitor 425, and the other end of the capacitor 425 is connected to the output terminal of the amplifier 423.

An explanation of the internal constitution of the VCO 150 will be omitted.

Next, the operation of the PLL circuit 100 related to this embodiment will be explained.

Input of a clock as a reference signal Vf commences from outside the PLL circuit 100. The signal Vf thereof is inputted to the phase comparators 110, 120. In addition, the phase comparators 110, 120 input a feedback signal Vc from the VCO 150. Usually, immediately following the startup of operation, the phases of the signals Vf, Vc do not match.

The phase comparators 110, 120 detect the phase difference of the two signals Vf, Vc by comparing the trailing edge timings of the reference signal Vf and the feedback signal Vc. As explained above, the dead zone of phase comparator 110 is expressed by $-\tau1<\delta<\tau1$, and the dead zone of phase comparator 120 is expressed by $-\tau2<\delta<\tau2$, and $\tau2>\tau1>0$. Therefore, the relationship between the phase difference $\delta$, and the signal levels of signals up1, up2, dn1, dn2 becomes as shown in FIG. 5. The operation of phase comparators 110, 120 will be explained hereinbelow in the sequence of when $-\tau2>\delta\geq-\tau1$, when $-\tau1\leq\delta<\tau2$, when $\delta\leq-\tau2$, and when $\tau2\leq\delta$.

(1) FIG. 6A is a signal diagram of when $-\tau2>\delta\geq-\tau1$.

Phase comparator 110 (Refer to FIG. 2A) operates as will be explained hereinbelow.

When signals Vf, Vc are both high level, inside phase comparator 110, the outputs of NAND gates 201, 202 are low level, the outputs of RS latches 203, 204 are high level, the output of NAND gate 205 is high level, and the outputs of NAND gates 206, 207 are high level. Therefore, charge-up signal up1 and charge-down signal dn1 are low level.

When the feedback signal Vc changes to low level, the output of NAND gate 202 changes to high level, and consequently, the output of NAND gate 207 changes to low level. Therefore, the charge-down signal dn1 changes to high level. The output of NAND gate 202 is inputted to RS latch 204, and NAND gate 205 as well, but the outputs of the logic circuits 204, 205 thereof do not change.

Continuing, when the reference signal Vf changes to low level, the output of NAND gate 201 changes to high level, and consequently, because all the inputs of NAND gate 205 become high level, the output of this NAND gate 205 changes to low level. In addition, when the output of NAND gate 205 becomes low level, the outputs of RS latches 203, 204 change to low level. In accordance therewith, the output of NAND gate 206 is maintained at low level, and the output of NAND gate 207 changes from high level to low level. Therefore, charge-up signal up1 is maintained at low level, and charge-down signal dn1 changes to low level.

By so doing, the phase comparator 110 outputs a charge-down signal dn1 of the same pulse width as the phase difference $\delta$.

Phase comparator 120 (Refer to FIG. 2B) operates as will be explained hereinbelow.

When signals Vf, Vc are both high level, the output level of each logic element inside phase comparator 120 is the same as phase comparator 110.

When the feedback signal Vc changes to low level, the output of NAND gate 202 of phase comparator 120 changes to high level. However, since inverters 214, 215 exist, the output signal of NAND gate 202 is delayed, and does not reach NAND gate 207 right away.

In phase comparator 120, the reference signal Vf changes to low level before the output signal of NAND gate 202 reaches NAND gate 207. When the reference signal Vf becomes low level, the output of NAND gate 201 changes to high level, and consequently, the output of NAND gate 205 changes to low level. Then the output signal of NAND gate 205 reaches NAND gate 207 faster than the output signal of NAND gate 202. Therefore, even when the output signal of NAND gate 202 reaches NAND gate 207, the output of NAND gate 207 is maintained at low level. For this reason, the output level of charge-down signal dn2 does not change.

(2) FIG. 6B is a signal diagram of when $\tau1\leq\delta<\tau2$.

Phase comparator 110 operates as [will be explained] hereinbelow.

Similar to the case of (1) hereinabove, when signals Vf, Vc are both high level, inside phase comparator 110, the outputs of NAND gates 201, 202 are low level, the outputs of RS latches 203, 204 are high level, the output of NAND gate 205 is high level, and the outputs of NAND gates 206, 207 are high level. Therefore, charge-up signal up1 and charge-down signal dn1 are low level.

When the reference signal Vf changes to low level, the output of NAND gate 201 changes to high level, and consequently, the output of NAND gate 206 changes to low level. Therefore, the charge-up signal up1 changes to high level. The output of NAND gate 201 is inputted to RS latch 203, and NAND gate 205 as well, but the outputs of the logic circuits 203, 205 thereof do not change.

Continuing, when the feedback signal Vc changes to low level, the output of NAND gate 202 changes to high level, and consequently, because all the inputs of NAND gate 205 become high level, the output of this NAND gate 205 changes to low level. In addition, when the output of NAND gate 205 becomes low level, the outputs of RS latches 203, 204 change to low level. In accordance therewith, the output of NAND gate 207 is maintained at low level, and the output of NAND gate 206 changes from high level to low level. Therefore, charge-down signal dn1 is maintained at low level, and charge-up signal up1 changes to low level.

By so doing, the phase comparator 110 outputs a charge-up signal up1 of the same pulse width as the phase difference $\delta$.

Phase comparator 120 operates as will be explained hereinbelow.

When signals Vf, Vc are both high level, the output level of each logic element 201–211 inside phase comparator 120 is the same as phase comparator 110.

When the reference signal Vf changes to low level, the output of NAND gate 201 of phase comparator 120 changes to high level. However, since inverters 212, 213 exist, the output signal of NAND gate 201 is delayed, and does not reach NAND gate 206 right away.

In phase comparator 120, the feedback signal Vc changes to low level before the output signal of NAND gate 201 reaches NAND gate 206. When the feedback signal Vc becomes low level, the output of NAND gate 202 changes to high level, and consequently, the output of NAND gate 205 changes to low level. Then the output signal of NAND gate 205 reaches NAND gate 206 faster than the output signal of NAND gate 201. Therefore, even when the output signal of NAND gate 201 reaches NAND gate 206, the output of NAND gate 206 is maintained at low level. For this reason, the output level of charge-down signal dn2 does not change.

Figure 6C:
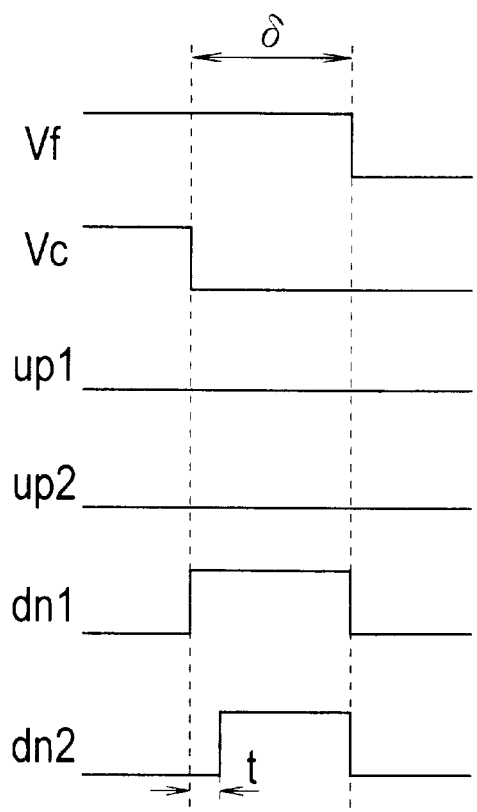

(3) FIG. 6C is a signal diagram of when $\delta \leq -\tau 2$.

The operation of phase comparator 110 is exactly the same as the case of (1) explained hereinabove. Phase comparator 110 outputs a charge-down signal dn1 of the same pulse width as the phase difference $\delta$.

In phase comparator 120, the fact that the output of NAND gate 202 of phase comparator 120 changes to high level when the feedback signal Vc changes to low level, is the same as the case of (1) explained hereinabove.

In the case of FIG. 6C, the absolute value of the phase difference 6 is larger than the delay time t resulting from inverters 214, 215. Therefore, the output signal of NAND gate 202 reaches NAND gate 207 via inverters 214, 215 before the reference value Vf changes.

When the output of NAND gate 207 changes to low level, charge-down signal dn2 changes to high level. The output of NAND gate 202 is inputted to RS latch 204, and NAND gate 205 as well, but the outputs of the logic circuits 204, 205 thereof do not change.

Continuing, when the reference signal Vf changes to low level, the output of NAND gate 201 changes to high level, and consequently, because all the inputs of NAND gate 205 become high level, the output of this NAND gate 205 changes to low level. In addition, when the output of NAND gate 205 becomes low level, the outputs of RS latches 203, 204 change to low level. In accordance therewith, the output of NAND gate 206 is maintained at low level, and the output of NAND gate 207 changes from high level to low level. Therefore, charge-up signal up2 is maintained at low level, and charge-down signal dn2 changes to low level.

By so doing, the phase comparator 120 outputs a charge-down signal dn2 of a pulse width shorter by delay time t than the phase difference $\delta$.

Figure 6D:
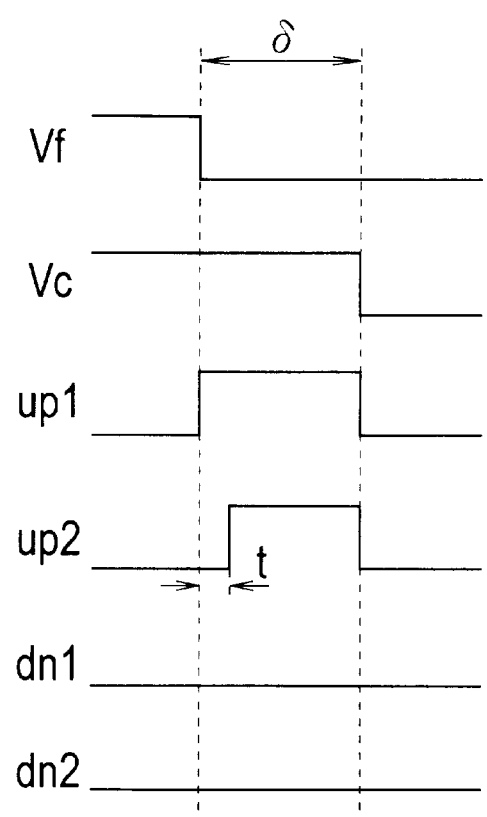

(4) FIG. 6D is a signal diagram of when $\tau 2 \leq \delta$.

The operation of phase comparator 110 is exactly the same as the case of (2) explained hereinabove. Phase comparator 110 outputs a charge-up signal up1 of the same pulse width as the phase difference $\delta$.

In phase comparator 120, the fact that the output of NAND gate 202 of phase comparator 120 changes to high level when the reference signal Vf changes to low level, is the same as the case of (2) explained hereinabove.

In the case of FIG. 6D, the absolute value of the phase difference $\delta$ is larger than the delay time t resulting from inverters 212, 213. Therefore, the output signal of NAND gate 201 reaches NAND gate 206 via inverters 212, 213 before the reference value Vf changes.

When the output of NAND gate 206 changes to low level, charge-up signal up2 changes to high level. The output of NAND gate 201 is inputted to RS latch 203, and NAND gate 205 as well, but the outputs of the logic circuits 203, 205 thereof do not change.

Continuing, when the feedback signal Vc changes to low level, the output of NAND gate 202 changes to high level, and consequently, because all the inputs of NAND gate 205 become high level, the output of this NAND gate 205 changes to low level. In addition, when the output of NAND gate 205 becomes low level, the outputs of RS latches 203, 204 change to low level. In accordance therewith, the output of NAND gate 207 is maintained at low level, and the output of NAND gate 206 changes from high level to low level. Therefore, charge-down signal dn2 is maintained at low level, and charge-up signal up2 changes to low level.

By so doing, the phase comparator 120 outputs a charge-up signal up2 of a pulse width shorter by delay time t than the phase difference $\delta$.

In this embodiment, the delay time resulting from inverters 212, 213 was made the same value (that is, t) as the delay time resulting from inverters 214, 215, but the two values need not be identical.

The output signals up1, up2, dn1, dn2 of phase comparators 110, 120 are inputted to the charge pump circuit 130 (Refer to FIG. 3). In the explanation of hereinbelow, the impedance of transistors 301-304 is ignored.

Transistors 301–304 inside the charge pump circuit 130 are returned ON/OFF in accordance with the potential of signals up1, up2, dn1, dn2.

In the case of when signal dn1 is high level and the other signals up1, up2, dn2 are low level (Refer to FIG. 6A), only transistor 302 is ON, and the other transistors 301, 303, 304 are OFF. Therefore, of resistors 305–308, since current only flows to resistor 306, the impedance of inside the charge pump circuit 130 constitutes R2.

In the case of when signal up1 is high level and the other signals up2, dn1, dn2 are low level (Refer to FIG. 6B), only transistor 301 is ON, and the other transistors 302–304 are OFF. Therefore, since current only flows to resistor 305, the impedance of inside the charge pump circuit 130 constitutes R1.

In the case of when signals dn1, dn2 are high level and the other signals up1, up2 are low level (Refer to FIG. 6C), transistors 302, 304 are ON, and transistors 301, 303 are OFF. Therefore, since current flows to resistors 306, 308, the internal impedance of the charge pump circuit 130 constitutes $R2 \cdot R4/(R2+R4)$. Here, because $R2 > R2 \cdot R4/(R2+R4)$, internal impedance of when signals dn1, dn2 are high level becomes smaller than the internal impedance of when signal dn1 is high level. Therefore, current outputted from terminal 315 becomes larger when signals dn1, dn2 are high level than when signal dn1 is high level.

In the case of when signals up1, up2 are high level and the other signals dn1, dn2 are low level (Refer to FIG. 6D), transistors 301, 303 are ON, and transistors 302, 304 are OFF. Therefore, since current flows to resistors 305, 307, the internal impedance of the charge pump circuit 130 constitutes $R1 \cdot R3/(R1+R3)$. Here, because $R1 > R1 \cdot R3/(R1+R3)$, the internal impedance of when signals up1, up2 are high level becomes smaller than the internal impedance of when signal up1 is high level. Therefore, current outputted from terminal 315 becomes larger when signals up1, up2 are high level than when signal up1 is high level.

Either the current outputted from terminal 315, or the current inputted to terminal 315 constitutes either the charging current or the discharging current of the loop filter 140.

In the case of the loop filter 140 of FIG. 4A, the output current of the charge pump circuit 130 is inputted from terminal 411, and charges capacitor 414 by way of resistor 413. In accordance therewith, the potential of the capacitor 414 rises. This potential is outputted from terminal 412 as control voltage.

In the case of the loop filter 140 of FIG. 4B, the output current of the charge pump circuit 130 is inputted from terminal 421, and charges capacitor 425 by way of resistor 424. In accordance therewith, the current signal inputted from terminal 421 is converted to voltage. The amplifier 423 amplifies this voltage. The amplified voltage is outputted from terminal 422 as control voltage.

A voltage signal outputted from the loop filter 140 is inputted to the VCO 150. The VCO 150 adjusts the frequency of an oscillation signal Vo in accordance with the value of the voltage signal thereof. As explained hereinabove, the oscillation signal Vo is outputted to the outside, as well as inputted to the phase comparators 110, 120 as feedback signals Vc.

The series of operations of hereinabove are implemented continuously until the phase difference δ of signals Vf, Vc falls within the dead zone of phase comparator 110, that is, until it constitutes $-\tau 1 < \delta < \tau 1$. When the phase difference δ falls within the dead zone, the output signals up1, up2, dn1, dn2 of phase comparators 110, 120 are maintained at low level. The state thereof is a locked state. In a locked state, an oscillation signal Vo is substantially synchronized with a reference signal Vf. That is, in a locked state, the phase and frequency of an oscillation signal Vo are substantially identical to the phase and frequency of a reference signal Vf.

As explained hereinabove, to shorten locking time, it is desirable for the time constant of a PLL circuit to be small, but to achieve sufficient operational stability, it is desirable for this time constant to be large. In regard thereto, as for the PLL circuit 100 of this embodiment, when the absolute value of a phase difference δ is larger than a reference value, that is, when either $\delta \leq -\tau 2$ or $\tau 2 < \delta$, the time constant of the PLL circuit as a whole is made smaller by making the internal impedance of the charge pump smaller, and when the absolute value of a phase difference δ is smaller than a reference value (except when it is smaller than the dead zone of phase comparator 110), that is, when either $-\tau 2 \geq \delta \geq -\tau 1$ or $\tau 1 \leq \delta < \tau 2$, the time constant of the PLL circuit as a whole is made larger by making the internal impedance of the charge pump larger. When the time constant is made smaller, since either the charging current or the discharging current supplied to the loop filter 140 from the charge pump circuit 130 becomes larger, it is possible to shorten locking time. Conversely, when the time constant is made larger, since either the charging current or the discharging current becomes smaller, it is possible to stabilize the operation of the PLL circuit 100. Therefore, the PLL circuit 100 of this embodiment features short locking time, and stable operation.

The wider the dead zone of phase comparator 110, that is, the larger the absolute value of τ1, the worse the stability of the PLL circuit 100. When stability is bad, trouble occurs, such as, for example, an error between a reference signal Vf and an oscillation signal Vo becomes larger. To improve the stability of the PLL circuit 100, it is desirable that the dead zone of phase comparator 110 be made as narrow as possible. By contrast thereto, the width of the dead zone of phase comparator 120 determines the reference value of the phase difference δ for switching the time constant of PLL circuit 100. Therefore, the absolute value of τ2 is determined having in mind the shortening of locking time and the assurance of stable operation of PLL circuit 100. For example, a stable PLL circuit can be achieved by setting the dead zone of phase comparator 110 to within ±10 picoseconds, and setting the dead zone of phase comparator 120 to more than ±100 picoseconds.

The dead zone of phase comparator 120 can be set, for example, so that, in an unlocked state, the time constant becomes smaller, and in a locked state, the time constant becomes larger, that is, so that the time constant is switched at a timing when the oscillation signal Vo enters a locked state.

Further, it is also possible for the dead zone of phase comparator 120 to be set wider than the range of a locked state. In this case, when the phase difference δ diminishes, and reaches a certain reference value, the PLL circuit 100 switches from a state wherein the time constant is large, to a state wherein the time constant is small, and thereafter, when the phase difference δ diminishes further, the PLL circuit 100 reaches a locked state.

The width of a dead zone is set in phase comparators 110, 120 in accordance with the propagation delay quantity of a signal. As explained hereinabove, the propagation delay quantity of phase comparator 120 is intentionally set by inverters 212–215. Further, the propagation delay quantities of phase comparators 110, 120 can also be set by adjusting the gate capacities of those NAND circuit 205 transistors, which are connected to the input terminals of NAND circuits 201, 202. Making the gate capacities of the transistors thereof smaller, causes a dead zone to become narrower.

Figure 7:
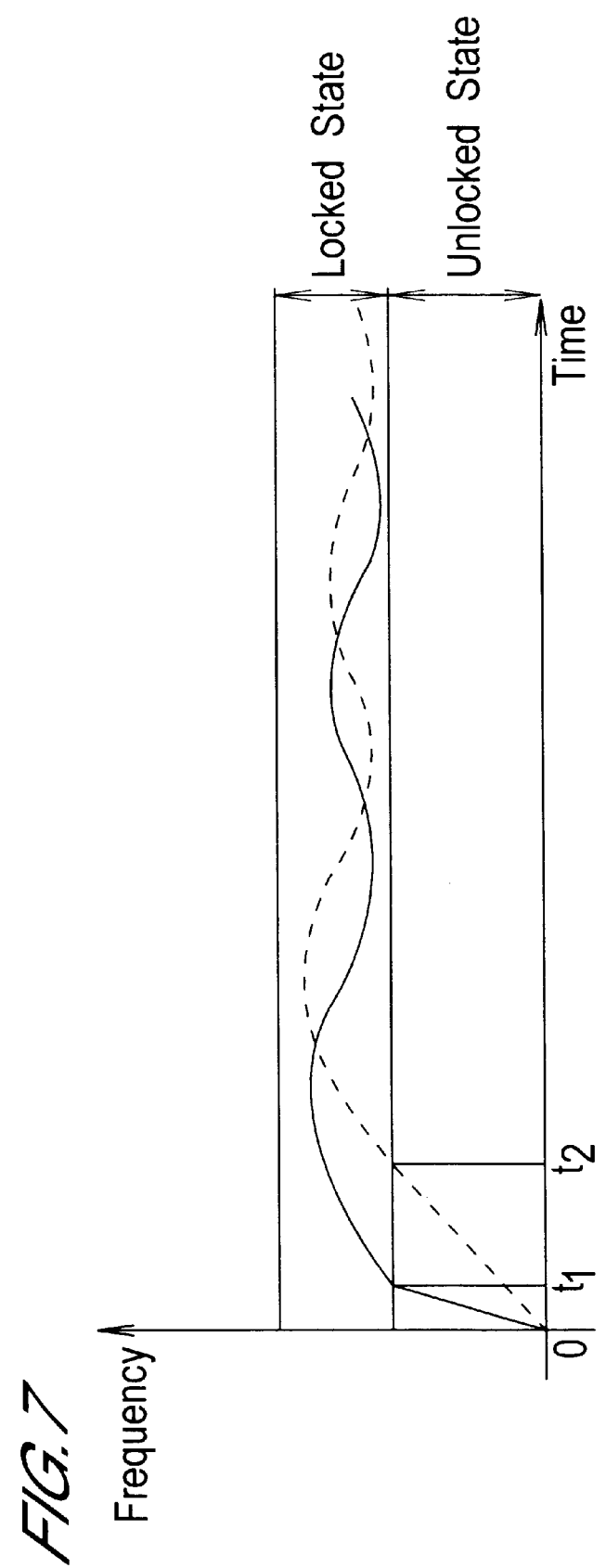
FIG. 7 is a graph for explaining the operation of the PLL circuit shown in FIG. 1.

FIG. 7 is a graph conceptually showing a temporal change of an oscillation signal Vo outputted from a PLL circuit. In FIG. 7, the vertical axis is a control voltage outputted by the loop filter 140, and the horizontal axis is time. In FIG. 7, the control voltage of a PLL circuit to which this embodiment applies is indicated by A, and the control voltage of a PLL circuit comprising only 1 phase comparator is indicated by B.

As can be seen from FIG. 7, in a PLL circuit comprising only 1phase comparator, control voltage B slowly rises, reaches a locked state, and repeats a gentle damped oscillation.

Conversely, in a PLL circuit of this embodiment, control voltage A rises rapidly in an initial state, and after reaching a locked state, performs a gentle damped oscillation.

In FIG. 7, t1 indicates the timing at which the PLL circuit of this embodiment reached a locked state, and t2 indicates the timing at which the PLL circuit comprising only 1 phase comparator reached a locked state. According to the PLL circuit of this embodiment, locking time can be shortened from t2 to t1. In addition, for the PLL circuit of this embodiment, the entire circuit design can be performed with separate consideration being given to design conditions for ensuring operational stability, and to design conditions for shortening locking time. Therefore, the PLL circuit of this embodiment can shorten locking time without losing operational stability, and is easy to design.

FIG. 8A–FIG. 8E are circuit diagrams showing examples of other constitutions of the charge pump circuit 130.

Figure 8A:
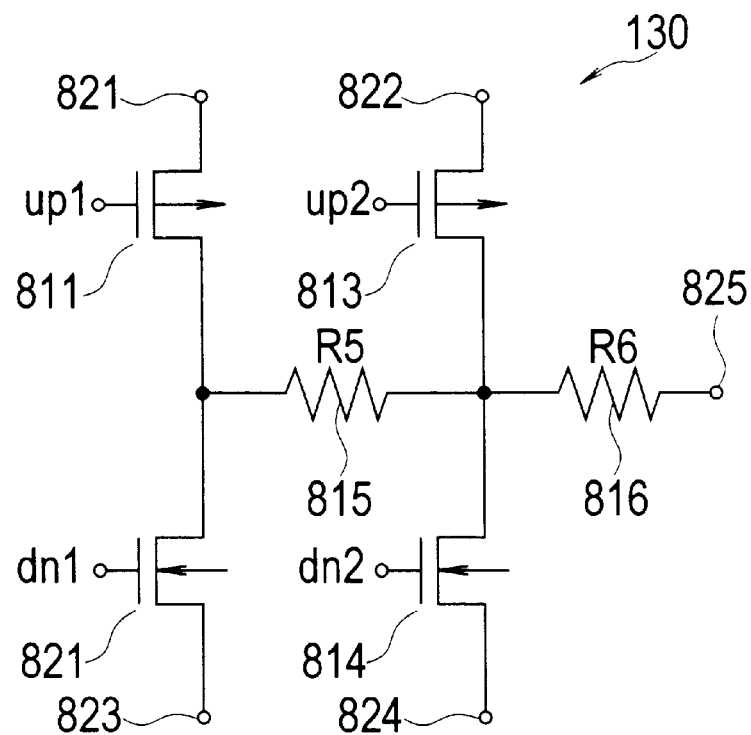
FIG. 8A, FIG. 8B, FIG. 8C, FIG. 8D and FIG. 8E are circuit diagrams showing examples of other internal constitutions of a charge pump circuit.

The charge pump circuit 130 of FIG. 8A comprises pMOS transistors 811, 813, nMOS transistors 812, 814, and resistors 815, 816. The resistance value of resistor 815 is R5, and the resistance value of resistor 816 is R6.

In pMOS transistor 811, the gate inputs a charge-up signal up1, the source is connected by way of a terminal 821 to a constant voltage power source not shown in the figure, and the drain is connected to a current terminal 825 by way of resistors 815, 816.

In nMOS transistor 812, the gate inputs a charge-down signal dn1, the source is connected to a ground by way of a terminal 823, and the drain is connected to current terminal 825 by way of resistors 815, 816.

In pMOS transistor 813, the gate inputs a charge-up signal up2, the source is connected by way of a terminal 822 to a constant voltage power source not shown in the figure, and the drain is connected to current terminal 825 by way of resistor 816.

In nMOS transistor 814, the gate inputs a charge-down signal dn2, the source is connected to a ground by way of a terminal 824, and the drain is connected to current terminal 825 by way of resistors 816.

In the charge pump circuit 130 of FIG. 8A, impedance corresponding to transistors 811, 812 is R5+R6, and impedance corresponding to transistors 813, 814 is R6. Therefore, combined impedance when signals up1, up2 are high level becomes smaller than impedance when signal up1 is high level, and combined impedance when signals dn1, dn2 are high level becomes smaller than impedance when signal dn1 is high level.

The charge pump circuit 130 of FIG. 8A has the advantage of having fewer elements than the charge pump circuit 130 of FIG. 3.

Figure 8B:
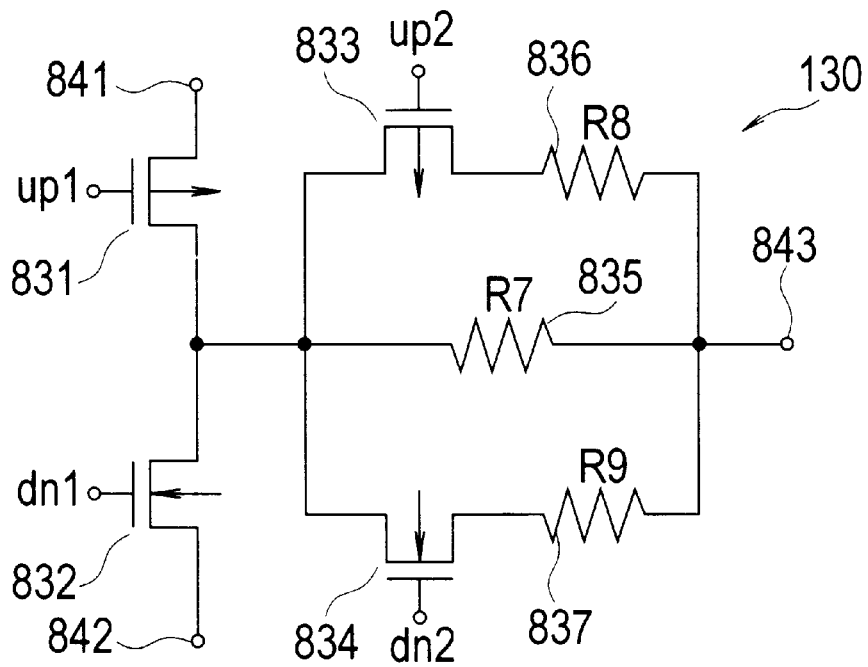

The charge pump circuit 130 shown in FIG. 8B comprises pMOS transistors 831, 833, nMOS transistors 832, 834, and resistors 835, 836, 837. The resistance value of resistor 835 is R7, the resistance value of resistor 836 is R8, and the resistance value of resistor 837 is R9.

In pMOS transistor 831, the gate inputs a charge-up signal up1, the source is connected by way of a terminal 841 to a constant voltage power source not shown in the figure, and the drain is connected to a terminal 843 by way of resistors 815.

In nMOS transistor 832, the gate inputs a charge-down signal dn1, the source is connected to a ground by way of a terminal 842, and the drain is connected to terminal 843 by way of resistors 835.

In PMOS transistor 833, the gate inputs a charge-up signal up2, the source is connected to the drain of pMOS transistor 831, and the drain is connected to current terminal 843 by way of resistor 836.

In nMOS transistor 834, the gate inputs a charge-down signal dn2, the source is connected to terminal 843 by way of resistor 837, and the drain is connected to the drain of nMOS transistor 832.

In the charge pump circuit 130 of FIG. 8B, internal impedance when the charge-up signal up1 is high level is R7, and internal impedance when the charge-up signals up1, up2 are high level is R7·R8/(R7+R8). Since R7>R7·R8/(R7+R8), internal impedance of when signals up1, up2 are high level is smaller than internal impedance of when signal up1 is high level.

Furthermore, internal impedance when the charge-down signal dn1 is high level is R7, and internal impedance when the charge-down signals dn1, dn2 are high level is R7·R9/(R7+R9). Since R7>R7·R9/(R7+R9), internal impedance of when signals dn1, dn2 are high level is smaller than internal impedance of when signal dn1 is high level.

The charge pump circuit 130 of FIG. 8B has the advantage of having fewer elements than the charge pump circuit 130 of FIG. 3.

Figure 8C:
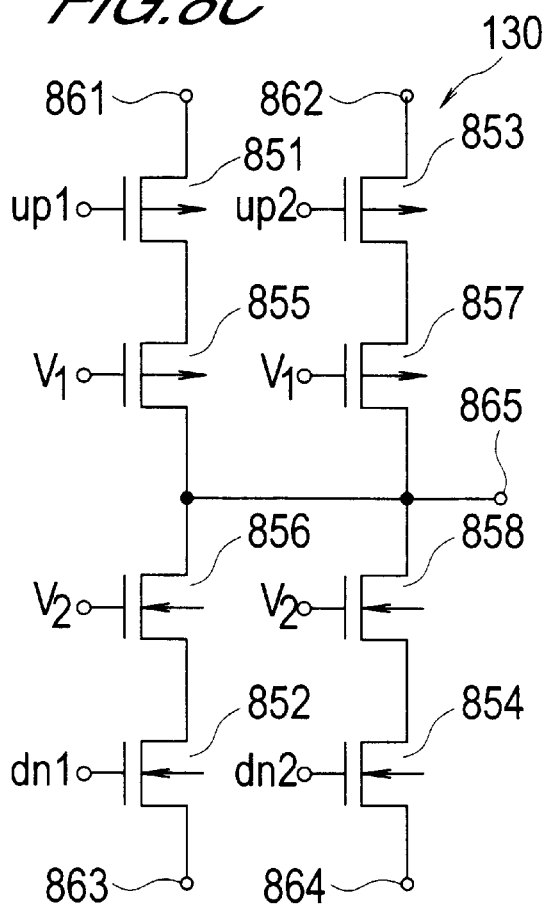

The charge pump circuit 130 shown in FIG. 8C comprises pMOS switching transistors 851, 853, nMOS switching transistors 852, 854, pMOS resistive transistor elements 855, 857, and nMOS resistive transistor elements 856, 858.

In pMOS transistor 851, the gate inputs a charge-up signal up1, and the source is connected by way of a terminal 861 to a constant voltage power source not shown in the figure.

In nMOS transistor 852, the gate inputs a charge-down signal dn1, and the source is connected to a ground by way of a terminal 863.

In pMOS transistor 853, the gate inputs a charge-up signal up2, and the source is connected by way of a terminal 862 to a constant voltage power source not shown in the figure.

In nMOS transistor 854, the gate inputs a charge-down signal dn2, and the source is connected to a ground by way of a terminal 864.

In pMOS transistor 855, the gate inputs a control voltage V1, the source is connected to the drain of pMOS transistor 851, and the drain is connected to current terminal 865.

In nMOS transistor 856, the gate inputs a control voltage V2, the source is connected to the drain of nMOS transistor 852, and the drain is connected to current terminal 865.

In pMOS transistor 857, the gate inputs a control voltage V1, the source is connected to the drain of pMOS transistor 853, and the drain is connected to current terminal 865.

In nMOS transistor 858, the gate inputs a control voltage V2, the source is connected to the drain of nMOS transistor 854, and the drain is connected to current terminal 865.

In the charge pump circuit 130 of FIG. 8C, the same control voltage V1 is inputted to the pMOS resistive transistors 855, 857. Therefore, when the resistance value of pMOS transistor 855, and the resistance value of pMOS transistor 857 are to be set to different values, transistors having different transistor characteristics (gate voltage—drain current characteristics) are used as these pMOS transistors 855, 857.

Similarly, the same control voltage V2 is inputted to the nMOS resistive transistors 856, 858. Therefore, when the resistance value of nMOS transistor 856, and the resistance value of nMOS transistor 858 are to be set to different values, transistors having different transistor characteristics (gate voltage—drain current characteristics) are used as these nMOS transistors 856, 858.

In the charge pump circuit 130 of FIG. 8C, because MOS transistors 855–858 are used as resistors, this charge pump has the advantage of enabling the occupied surface area of the resistors to be made smaller.

Figure 8D:
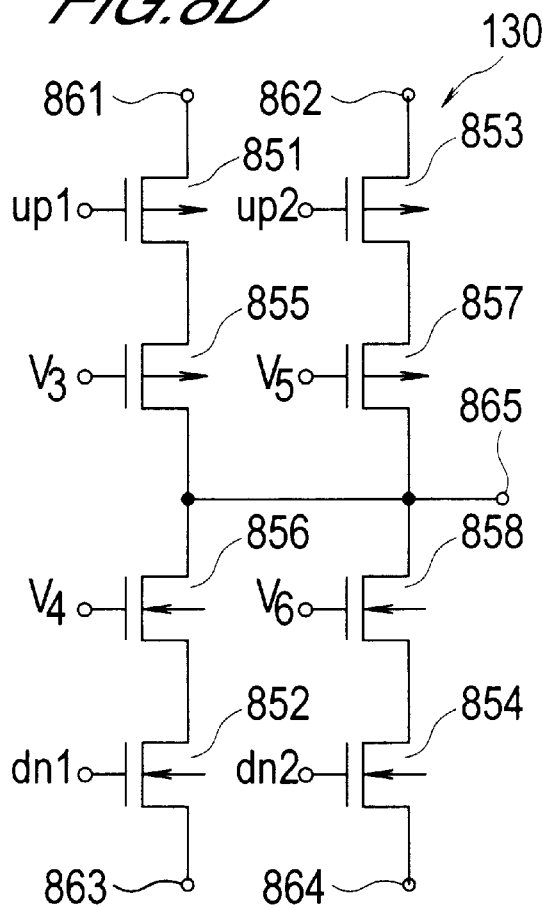

The charge pump circuit 130 shown in FIG. 8D differs from the charge pump in FIG. 8C in that the control voltage supplied to the gates of the MOS resistive transistors 855–858 differ respectively. As shown in FIG. 8D, control voltage V3 is supplied to pMOS transistor 855, control voltage V4 is supplied to nMOS transistor 856, control voltage V5 is supplied to pMOS transistor 857, and control voltage V6 is supplied to nMOS transistor 858, respectively.

Because the charge pump circuit 130 of FIG. 8D uses MOS transistors 855–858 as resistors, this charge pump has the advantage of enabling the occupied surface area of the resistors to be made smaller. In addition, because a resistance value is set in accordance with control voltages V1–V6, the same size transistor can be used as pMOS transistors 855, 857, and the same size transistor can be used as nMOS transistors 856, 858.

Figure 8E:
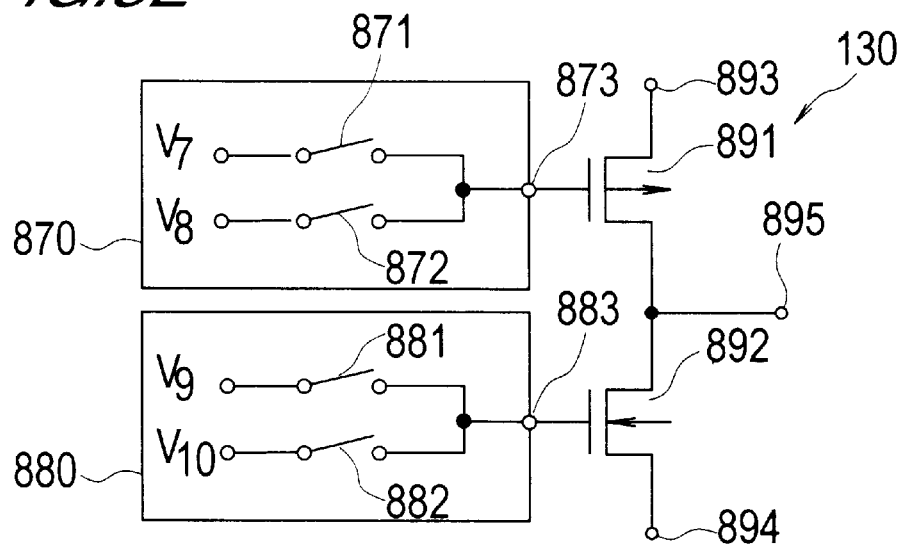

The charge pump circuit 130 shown in FIG. 8E comprises a first bias generating circuit 870, a second bias generating circuit 880, a PMOS transistor 891, and an nMOS transistor 892.

Bias generating circuit 870 comprises 2 switches 871, 872. Switch 871 inputs control voltage V7 from the one end, and the other end is connected to a voltage terminal 873. Switch 872 inputs control voltage V8 from the one end, and the other end is connected to a voltage terminal 873. As will be explained hereinbelow, the opening and closing of switches 871, 872 is controlled using charge-up signals up1, up2, and the inverted signal upb2 (Refer to FIG. 2).

Bias generating circuit 880 comprises 2 switches 881, 882. Switch 881 inputs control voltage V9 from the one end, and the other end is connected to a voltage terminal 883. Switch 882 inputs control voltage V10 from the one end, and the other end is connected to a voltage terminal 883. As will be explained hereinbelow, the opening and closing of switches 881, 882 is controlled using charge-down signals dn1, dn2, and the inverted signal dnb2 (Refer to FIG. 2).

As for pMOS transistor 891, the gate is connected to the voltage terminal 873 of bias generating circuit 870, the source is connected by way of a terminal 893 to a constant voltage power source not shown in the figure, and the drain is connected to a current terminal 895.

As for nMOS transistor 892, the gate is connected to the voltage terminal 883 of bias generating circuit 880, the source is connected to a ground by way of a terminal 894, and the drain is connected to current terminal 895.

Switch 871 of bias generating circuit 870 closes when charge-up signals up1, up2 are both high level, and opens when otherwise. Switch 872 closes when charge-up signals up1, upb2 are both high level, and opens when otherwise. In accordance therewith, pMOS transistor 891 operates by gate voltage V7 when signals up1, up2 are both high level, operates by gate voltage V8 when signals up1, upb2 are both high level, and does not operate when otherwise. As for the voltages V7, V8, selection is such that, with gate voltage V7, the source-to-drain resistance of transistor 891 becomes smaller, and with gate voltage V8, the source-to-drain resistance of transistor 891 becomes larger. In accordance therewith, the time constant of a PLL circuit becomes smaller when signals up1, up2 are both high level, and becomes larger when signals up1, upb2 are both high level.

Switch 881 of bias generating circuit 880 closes when charge-down signals dn1, dn2 are both high level, and opens when otherwise. Switch 882 closes when charge-down signals dn1, dnb2 are both high level, and opens when otherwise. In accordance therewith, nMOS transistor 892 operates by gate voltage V9 when signals dn1, dn2 are both high level, operates by gate voltage V10 when signals dn1, dnb2 are both high level, and does not operate when otherwise. As for the voltage V9, V10, selection is such that, with gate voltage V9, the source-to-drain resistance of transistor 892 becomes smaller, and with gate voltage V10, the source-to-drain resistance of transistor 892 becomes larger. In accordance therewith, the time constant of a PLL circuit becomes smaller when signals dn1, dn2 are both high level, and becomes larger when signals dn1, dnb2 are both high level.

The charge pump circuit 130 of FIG. 8E can be realized using a small circuit.

In this manner, because a PLL circuit of the present invention switches the size of a time constant in accordance with the size of a phase difference between a reference signal Vf and a feedback signal Vc, locking time is shortened, and operation is stable.

What is claimed is:

1. A Phase Locked Loop circuit, comprising:
    a first phase comparator for detecting the phase difference between a feedback signal and an input reference signal, and outputting a first compare signal including a first phase lead detection signal and a first phase lag detection signal, said first phase lead and said first phase lag detection signals indicating when said phase difference is not within a dead zone of said first comparator;
    a second phase comparator for detecting the phase difference between said feedback signal and said reference signal, and outputting a second compare signal including a second phase lead detection signal and a second phase lag detection signal, said second phase lead and second phase lag detection signals indicating when said phase difference is not within a dead zone that is wider than said dead zone of said first phase comparator;
    a supplier, receiving said first and second compare signals, that judges that said phase difference is large when both of said first and second comparators recognize that said phase difference is not within a dead zone of said first and second comparators, and that judges that said phase difference is small when said first comparator recognizes that said phase difference is not within a dead zone of said first comparator and said second comparator recognizes that said phase difference is within a dead zone of said second comparator;
    an output signal generator for generating an output signal, for outputting said output signal to said first and second phase comparator as said feedback signal, and for modifying the phase of said output signal in accordance with the judgment of said supplier
    wherein said supplier supplies either a positive current or a negative current in accordance with the polarity of said phase difference and connects at least one of a power line and a ground line to a current output terminal;
    wherein said power line and said current output terminal are connected via a first impedance when said first phase lead detection signal and said second phase lead detection signal are inputted and are connected via a second impedance, higher than said first impedance, when only said first phase lead detection signal is inputted; and
    wherein said ground line and said current output terminal are connected via a third impedance when said first phase lag detection signal and said second phase lag detection signal are inputted, and via a fourth impedance, higher than said third impedance, when only said second phase lag detection signal is inputted,
    wherein said supplier comprises:
        a first transistor, wherein a control electrode inputs said first phase lead detection signal, a main electrode of the one side is connected to said power line, and a main electrode of the other side is connected to said current output terminal by way of a first resistor;
        a second transistor, wherein a control electrode inputs said first phase lag detection signal, a main electrode of the one side is connected to said ground line, and a main electrode of the other side is connected to said current output terminal by way of a second resistor;
        a third transistor, wherein a control electrode inputs said second phase lead detection signal, a main electrode of the one side is connected to said power line, and a main electrode of the other side is connected to said current output terminal by way of a third resistor; and
        a fourth transistor, wherein a control electrode inputs said second phase lag detection signal, a main electrode of the one side is connected to said ground line, and a main electrode of the other side is connected to said current output terminal by way of a fourth resistor.

2. The Phase Locked Loop circuit according to claim 1, wherein said first comparator comprises:
    a first NAND gate for inputting said reference signal from an input terminal of the one side;
    a second NAND gate for inputting said feedback signal from an input terminal of the one side;

a first RS latch for inputting an output signal of said first NAND gate from an S input terminal;

a second RS latch for inputting an output signal of said second NAND gate from an S input terminal;

a third NAND gate for inputting an output signal of said first NAND gate, an output signal of said second NAND gate, an output signal of said first RS latch, and an output signal of said second RS latch, and for supplying an output signal to an R input terminal of said first and second RS latches;

a fourth NAND gate for inputting an output signal of said first NAND gate, an output signal of said first RS latch, and an output signal of said third NAND gate, and for supplying an output signal to an input terminal of the other side of said first NAND gate;

a fifth NAND gate for inputting an output signal of said second NAND gate, an output signal of said second RS latch, and an output signal of said third NAND gate, and for supplying an output signal to an input terminal of the other side of said second NAND gate;

a first inverter for outputting an inverted signal of an output signal of said fourth NAND gate as said first phase lead detection signal; and a second inverter for outputting an inverted signal of an output signal of said fifth NAND gate as said first phase lag detection signal.

3. The Phase Locked Loop circuit according to claim 2, further comprising:

a third inverter for outputting an inverted signal of an output signal of said first inverter; and a fourth inverter for outputting an inverted signal of an output signal of said second inverter.

4. The Phase Locked Loop circuit according to claim 1, wherein said second comparator comprises:

a first NAND gate for inputting said reference signal from an input terminal of the one side;

a second NAND gate for inputting said feedback signal from an input terminal of the one side;

a first RS latch for inputting an output signal of said first NAND gate from an S input terminal;

a second RS latch for inputting an output signal of said second NAND gate from an S input terminal;

a first delaying element for inputting an output signal of said first NAND gate;

a second delaying element for inputting an output signal of said second NAND gate;

a third NAND gate for inputting an output signal of said first NAND gate, an output signal of said second NAND gate, an output signal of said first RS latch, and an output signal of said second RS latch, and for supplying an output signal to an R input terminal of said first and second RS latches;

a fourth NAND gate for inputting an output signal of said first delaying element, an output signal of said first RS latch, and an output signal of said third NAND gate, and for supplying an output signal to an input terminal of the other side of said first NAND gate;

a fifth NAND gate for inputting an output signal of said second delaying element, an output signal of said second RS latch, and an output signal of said third NAND gate, and for supplying an output signal to an input terminal of the other side of said second NAND gate;

a first inverter for outputting an inverted signal of an output signal of said fourth NAND gate as said second phase lead detection signal; and a second inverter for outputting an inverted signal of an output signal of said fifth NAND gate as said second phase lag detection signal.

5. The Phase Locked Loop circuit according to claim 4, further comprising:

a third inverter for outputting an inverted signal of an output signal of said first inverter; and a fourth inverter for outputting an inverted signal of an output signal of said second inverter.

6. The Phase Locked Loop circuit according to claim 4, wherein said first and second delaying elements, respectively, have a plurality of inverters.

7. A Phase Locked Loop circuit according to claim 1, wherein said output signal generator increases the phase of said output signal when said supplier judges that said phase difference is large; and wherein said output signal generator decreases the phase of said output signal when said supplier judges that said phase difference is small.

8. A Phase Locked Loop circuit according to claim 1, wherein:

said first compare signal has a first value indicating that said phase of said feedback signal lags the phase of said reference signal, and a second value indicating that said phase of said feedback signal leads the phase of said reference signal; and said second compare signal has a first value indicating that said phase of said feedback signal lags the phase of said reference signal, and a second value indicating that said phase of said feedback signal leads the phase of said reference signal.

9. A Phase Locked Loop circuit according to claim 1, wherein said output signal generator reduces the phase lag of said feedback signal when at least one of said first and second compare signals have said first value; and reduces the phase lead of said feedback signal when at least one of said first and second compare signals have said second value.

10. A Phase Locked Loop circuit, comprising:

a first phase comparator for detecting the phase difference between a feedback signal and an input reference signal, and outputting a first compare signal including a first phase lead detection signal and a first phase lag detection signal, said first phase lead and said first phase lag detection signals indicating when said phase difference is not within a dead zone of said first comparator;

a second phase comparator for detecting the phase difference between said feedback signal and said reference signal, and outputting a second compare signal including a second phase lead detection signal and a second phase lag detection signal, said second phase lead and said second phase lag detection signals indicating when said phase difference is not within a dead zone that is wider than said dead zone of said first phase comparator;

a supplier, receiving said first and second compare signals, that judges that said phase difference is large when both of said first and second comparators recognize that said phase difference is not within a dead zone of said first and second comparators, and that judges that said phase difference is small when said first comparator recognizes that said phase difference is not within a dead zone of said first comparator and said second comparator recognizes that said phase difference is within a dead zone of said second comparator;

an output signal generator for generating an output signal, for outputting said output signal to said first and second phase comparator as said feedback signal, and for modifying the phase of said output signal in accordance with the judgment of said supplier wherein said supplier supplies either a positive current or a negative current in accordance with the polarity of said phase difference and connects at least one of a power line and a ground line to a current output terminal;

wherein said power line and said current output terminal are connected via a first impedance when said first phase lead detection signal and said second phase lead detection signal are inputted and are connected via a second impedance, higher than said first impedance, when only said first phase lead detection signal is inputted; and wherein said ground line and said current output terminal are connected via a third impedance when said first phase lag detection signal and said second phase lag detection signal are inputted, and via a fourth impedance, higher than said third impedance, when only said second phase lag detection signal is inputted, wherein said supplier comprises:

a first transistor, wherein a control electrode inputs said first phase lead detection signal, a main electrode of the one side is connected to said power line, and a main electrode of the other side is connected to said current output terminal by way of a first resistor and a second resistor;

a second transistor, wherein a control electrode inputs said first phase lag detection signal, a main electrode of the one side is connected to said ground line and a main electrode of the other side is connected to said current output terminal by way of said first resistor and said second resistor;

a third transistor, wherein a control electrode inputs said second phase lead detection signal, a main electrode of the one side is connected to said power line, and a main electrode of the other side is connected to said current output terminal by way of said second resistor; and a fourth transistor, wherein a control electrode inputs said second phase lag detection signal, a main electrode of the one side is connected to said ground line, and a main electrode of the other side is connected to said current output terminal by way of said second resistor.

11. The Phase Locked Loop circuit according to claim 10, wherein said first comparator comprises:

a first NAND gate for inputting said reference signal from an input terminal of the one side;

a second NAND gate for inputting said feedback signal from an input terminal of the one side;

a first RS latch for inputting an output signal of said first NAND gate from an S input terminal;

a second RS latch for inputting an output signal of said second NAND gate from an S input terminal;

a third NAND gate for inputting an output signal of said first NAND gate, an output signal of said second NAND gate, an output signal of said first RS latch, and an output signal of said second RS latch, and for supplying an output signal to an R input terminal of said first and second RS latches;

a fourth NAND gate for inputting an output signal of said first NAND gate, an output signal of said first RS latch, and an output signal of said third NAND gate, and for supplying an output signal to an input terminal of the other side of said first NAND gate;

a fifth NAND gate for inputting an output signal of said second NAND gate, an output signal of said second RS latch, and an output signal of said third NAND gate, and for supplying an output signal to an input terminal of the other side of said second NAND gate;

a first inverter for outputting an inverted signal of an output signal of said fourth NAND gate as said first phase lead detection signal; and a second inverter for outputting an inverted signal of an output signal of said fifth NAND gate as said first phase lag detection signal.

12. The Phase Locked Loop circuit according to claim 10, wherein said second comparator comprises:

a first NAND gate for inputting said reference signal from an input terminal of the one side;

a second NAND gate for inputting said feedback signal from an input terminal of the one side;

a first RS latch for inputting an output signal of said first NAND gate from an S input terminal;

a second RS latch for inputting an output signal of said second NAND gate from an S input terminal;

a first delaying element for inputting an output signal of said first NAND gate;

a second delaying element for inputting an output signal of said second NAND gate;

a third NAND gate for inputting an output signal of said first NAND gate, an output signal of said second NAND gate, an output signal of said first RS latch, and an output signal of said second RS latch, and for supplying an output signal to an R input terminal of said first and second RS latches;

a fourth NAND gate for inputting an output signal of said first delaying element, an output signal of said first RS latch, and an output signal of said third NAND gate, and for supplying an output signal to an input terminal of the other side of said first NAND gate;

a fifth NAND gate for inputting an output signal of said second delaying element, an output signal of said second RS latch, and an output signal of said third NAND gate, and for supplying an output signal to an input terminal of the other side of said second NAND gate;

a first inverter for outputting an inverted signal of an output signal of said fourth NAND gate as said second phase lead detection signal; and a second inverter for outputting an inverted signal of an output signal of said fifth NAND gate as said second phase lag detection signal.

13. A Phase Locked Loop circuit, comprising:

a first phase comparator for detecting the phase difference between a feedback signal and an input reference signal, and outputting a first compare signal including a first phase lead detection signal and a first phase lag detection signal, said first phase lead and said first phase lag detection signals indicating when said phase difference is not within a dead zone of said first comparator;

a second phase comparator for detecting the phase difference between said feedback signal and said reference signal, and outputting a second compare signal including a second phase lead detection signal and a second phase lag detection signal, said second phase lead and said second phase lag detection signals indicating when said phase difference is not within a dead zone that is wider than said dead zone of said first phase comparator;

a supplier, receiving said first and second compare signals, that judges that said phase difference is large when both of said first and second comparators recognize that said phase difference is not within a dead zone of said first and second comparators, and that judges that said phase difference is small when said first comparator recognizes that said phase difference is not within a dead zone of said first comparator and said second comparator recognizes that said phase difference is within a dead zone of said second comparator;

an output signal generator for generating an output signal, for outputting said output signal to said first and second phase comparator as said feedback signal, and for modifying the phase of said output signal in accordance with the judgment of said supplier, wherein said supplier supplies either a positive current or a negative current in accordance with the polarity of said phase difference and connects at least one of a power line and a ground line to a current output terminal;

wherein said power line and said current output terminal are connected via a first impedance when said first phase lead detection signal and said second phase lead detection signal are inputted and are connected via a second impedance, higher than said first impedance, when only said first phase lead detection signal is inputted; and wherein said ground line and said current output terminal are connected via a third impedance when said first phase lag detection signal and said second phase lag detection signal are inputted, and via a fourth impedance, higher than said third impedance, when only said second phase lag detection signal is inputted, wherein said supplier comprises:
a first transistor, wherein a control electrode inputs said first phase lead detection signal, a main electrode of the one side is connected to said power line, and a main electrode of the other side is connected to said current output terminal by way of a first resistor;

a second transistor, wherein a control electrode inputs said first phase lag detection signal, a main electrode of the one side is connected to said ground line, and a main electrode of the other side current output terminal is connected to said current output terminal by way of said first resistor;

a third transistor, wherein a control electrode inputs said second phase lead detection signal, a main electrode of the one side is connected to said the other side main electrode of said first transistor, and a main electrode of the other side is connected to said current output terminal by way of an second resistor; and a fourth transistor, wherein a control electrode inputs said second phase lag detection signal, a main electrode of the one side is connected to said the other side main electrode of said second transistor, and a main electrode of the other side is connected to said current output terminal by way of a third resistor.

14. The Phase Locked Loop circuit according to claim 13, wherein said first comparator comprises:
a first NAND gate for inputting said reference signal from an input terminal of the one side;
a second NAND gate for inputting said feedback signal from an input terminal of the one side;
a first RS latch for inputting an output signal of said first NAND gate from an S input terminal;
a second RS latch for inputting an output signal of said second NAND gate from an S input terminal;
a third NAND gate for inputting an output signal of said first NAND gate, an output signal of said second NAND gate, an output signal of said first RS latch, and an output signal of said second RS latch, and for supplying an output signal to an R input terminal of said first and second RS latches;
a fourth NAND gate for inputting an output signal of said first NAND gate, an output signal of said first RS latch, and an output signal of said third NAND gate, and for supplying an output signal to an input terminal of the other side of said first NAND gate;
a fifth NAND gate for inputting an output signal of said second NAND gate, an output signal of said second RS latch, and an output signal of said third NAND gate, and for supplying an output signal to an input terminal of the other side of said second NAND gate;
a first inverter for outputting an inverted signal of an output signal of said fourth NAND gate as said first phase lead detection signal; and
a second inverter for outputting an inverted signal of an output signal of said fifth NAND gate as said first phase lag detection signal.

15. The Phase Locked Loop circuit according to claim 13, wherein said second comparator comprises:
a first NAND gate for inputting said reference signal from an input terminal of the one side;
a second NAND gate for inputting said feedback signal from an input terminal of the one side;
a first RS latch for inputting an output signal of said first NAND gate from an S input terminal;
a second RS latch for inputting an output signal of said second NAND gate from an S input terminal;
a first delaying element for inputting an output signal of said first NAND gate;
a second delaying element for inputting an output signal of said second NAND gate;
a third NAND gate for inputting an output signal of said first NAND gate, an output signal of said second NAND gate, an output signal of said first RS latch, and an output signal of said second RS latch, and for supplying an output signal to an R input terminal of said first and second RS latches;
a fourth NAND gate for inputting an output signal of said first delaying element, an output signal of said first RS latch, and an output signal of said third NAND gate, and for supplying an output signal to an input terminal of the other side of said first NAND gate;
a fifth NAND gate for inputting an output signal of said second delaying element, an output signal of said second RS latch, and an output signal of said third NAND gate, and for supplying an output signal to an input terminal of the other side of said second NAND gate;
a first inverter for outputting an inverted signal of an output signal of said fourth NAND gate as said second phase lead detection signal; and
a second inverter for outputting an inverted signal of an output signal of said fifth NAND gate as said second phase lag detection signal.

16. A Phase Locked Loop circuit, comprising:
a first comparing means for activating a first phase lag detection signal when a phase difference between a reference signal and a feedback signal is smaller than −τ1 (τ1>0), and for activating a first phase lead detection signal when a phase difference between said reference signal and said feedback signal is larger than τ1;

a second comparing means for activating a second phase lag detection signal when a phase difference between said reference signal and said feedback signal is smaller than −τ2 (τ2>τ1), and for activating a second phase lead detection signal when a phase difference between said reference signal and said feedback signal is larger than τ2;

a charge pump, receiving said first and second phase lag detection signals, for outputting a negative large charge current when said first and second phase lag detection signals are activated, outputting a negative small charge current when only said first phase lag detection signal is activated, outputting a positive large charge current when said first and second phase lead detection signals are activated, outputting a positive small charge current when only said first phase lead detection signal is activated;

a control signal generator, receiving said charge current, for discharging or charging an internal capacitor using said charge current, and outputting the electric potential of one terminal of said internal capacitor as a control signal; and a voltage control oscillator for generating a output signal, outputting said output signal to said first and second phase comparators as said feedback signal, and modifying the frequency of said output signal such that said frequency rises in accordance with the rise amount of said control signal and said frequency falls in accordance with the fall amount of said control signal.

17. The Phase Locked Loop circuit according to claim 16, wherein said charge pump comprises:

a first transistor, wherein a control electrode inputs said first phase lead detection signal, and a main electrode of the one side is connected to said power line;

a second transistor, wherein a control electrode inputs said first phase lag detection signal, and a main electrode of the one side is connected to said ground line;

a third transistor, wherein a control electrode inputs said second phase lead detection signal, and a main electrode of the one side is connected to said power line;

a fourth transistor, wherein a control electrode inputs said second phase lag detection signal, and a main electrode of the one side is connected to said ground line;

a fifth transistor, wherein a control electrode inputs a first impedance control voltage, a main electrode of the one side is connected to a main electrode of the other side of said first transistor, and an input terminal of the other side is connected to said current output terminal;

a sixth transistor, wherein a control electrode inputs a second impedance control voltage, a main electrode of the one side is connected to a main electrode of the other side of said second transistor, and a main electrode of the other side is connected to said current output terminal;

a seventh transistor, wherein a control electrode inputs said first impedance control voltage, a main electrode of the one side is connected to a main electrode of the other side of said third transistor, and a main electrode of the other side is connected to said current output terminal; and an eighth transistor, wherein a control electrode inputs said second impedance control voltage, a main electrode of the one side is connected to a main electrode of the other side of said fourth transistor, and a main electrode of the other side is connected to said current output terminal.

18. The Phase Locked Loop circuit according to claim 16, wherein said charge pump comprises:

a first transistor, wherein a control electrode inputs said first phase lead detection signal, and a main electrode of the one side is connected to said power line;

a second transistor, wherein a control electrode inputs said first phase lag detection signal, and a main electrode, of the one side is connected to said ground line;

a third transistor, wherein a control electrode inputs said second phase lead detection signal, and a main electrode of the one side is connected to said power line;

a fourth transistor, wherein a control electrode inputs said second phase lag detection signal, and a main electrode of the one side is connected to said ground line;

a fifth transistor, wherein a control electrode inputs a first impedance control voltage, a main electrode of the one side is connected to a main electrode of the other side of said first transistor, and a main electrode of the other side is connected to said current output terminal;

a sixth transistor, wherein a control electrode inputs a second impedance control voltage, a main electrode of the one side is connected to a main electrode of the other side of said second transistor, and a main electrode of the other side is connected to said current output terminal;

a seventh transistor, wherein a control electrode inputs a third impedance control voltage, a main electrode of the one side is connected to a main electrode of the other side of said third transistor, and a main electrode of the other side is connected to said current output terminal; and an eighth transistor, wherein a control electrode inputs a fourth impedance control voltage, a main electrode of the one side is connected to a main electrode of the other side of said fourth transistor, and a main electrode of the other side is connected to said current output terminal.

19. A Phase Locked Loop circuit, comprising:

a first phase comparator for detecting the phase difference between a feedback signal and an input reference signal, and outputting a first compare signal including a first phase lead detection signal and a first phase lag detection signal, said first phase lead and said first phase lag detection signals indicating when said phase difference is not within a dead zone of said first comparator;

a second phase comparator for detecting the phase difference between said feedback signal and said reference signal, and outputting a second compare signal including a second phase lead detection signal and a second phase lag detection signal, said second phase lead and said second phase lag detection signals indicating when said phase difference is not within a dead zone that is wider than said dead zone of said first phase comparator;

a supplier, receiving said first and second compare signals, that judges that said phase difference is large when both of said first and second comparators recognize that said phase difference is not within a dead zone of said first and second comparators, and that judges that said phase difference is small when said first comparator recognizes that said phase difference is not within a dead zone of said first comparator and said second comparator recognizes that said phase difference is within a dead zone of said second comparator;

an output signal generator for generating an output signal, for outputting said output signal to said first and second phase comparator as said feedback signal, and for modifying the phase of said output signal in accordance with the judgment of said supplier, wherein said supplier supplies either a positive current or a negative current in accordance with the polarity of said phase difference and connects at least one of a power line and a ground line to a current output terminal;

wherein said power line and said current output terminal are connected via a first impedance when said first phase lead detection signal and said second phase lead detection signal are inputted and are connected via a second impedance, higher than said first impedance, when only said first phase lead detection signal is inputted; and wherein said ground line and said current output terminal are connected via a third impedance when said first phase lag detection signal and said second phase lag detection signal are inputted, and via a fourth impedance, higher than said third impedance, when only said second phase lag detection signal is inputted, wherein said supplier comprises:

a first transistor, wherein a main electrode of the one side is connected to said power line, and a main electrode of the other side is connected to said current output terminal;

a second transistor, wherein a main electrode of the one side is connected to said ground line, and a main electrode of the other side is connected to said current output terminal;

a first switch for supplying a first impedance control voltage to a control electrode of said first transistor when said first phase lead detection signal and said second phase lead detection signal are inputted;

a second switch for supplying a second impedance control voltage to a control electrode of said first transistor when said first phase lead detection signal and an inverted signal of said second phase lead detection signal are inputted;

a third switch for supplying a third impedance control voltage to a control electrode of said second transistor when said first phase lag detection signal and said second phase lag detection signal are inputted; and a fourth switch for supplying a fourth impedance control voltage to a control electrode of said second transistor when said first phase lag detection signal and an inverted signal of said second phase lag detection signal are inputted.

20. The Phase Locked Loop circuit according to claim 19, wherein said first comparator comprises:

a first NAND gate for inputting said reference signal from an input terminal of the one side;

a second NAND gate for inputting said feedback signal from an input terminal of the one side;

a first RS latch for inputting an output signal of said first NAND gate from an S input terminal;

a second RS latch for inputting an output signal of said second NAND gate from an S input terminal;

a third NAND gate for inputting an output signal of said first NAND gate, an output signal of said second NAND gate, an output signal of said first RS latch, and an output signal of said second RS latch, and for supplying an output signal to an R input terminal of said first and second RS latches;

a fourth NAND gate for inputting an output signal of said first NAND gate, an output signal of said first RS latch, and an output signal of said third NAND gate, and for supplying an output signal to an input terminal of the other side of said first NAND gate;

a fifth NAND gate for inputting an output signal of said second NAND gate, an output signal of said second RS latch, and an output signal of said third NAND gate, and for supplying an output signal to an input terminal of the other side of said second NAND gate;

a first inverter for outputting an inverted signal of an output signal of said fourth NAND gate as said first phase lead detection signal; and a second inverter for outputting an inverted signal of an output signal of said fifth NAND gate as said first phase lag detection signal.

21. The Phase Locked Loop circuit according to claim 19, wherein said second comparator comprises:

a first NAND gate for inputting said reference signal from an input terminal of the one side;

a second NAND gate for inputting said feedback signal from an input terminal of the one side;

a first RS latch for inputting an output signal of said first NAND gate from an S input terminal;

a second RS latch for inputting an output signal of said second NAND gate from an S input terminal;

a first delaying element for inputting an output signal of said first NAND gate;

a second delaying element for inputting an output signal of said second NAND gate;

a third NAND gate for inputting an output signal of said first NAND gate, an output signal of said second NAND gate, an output signal of said first RS latch, and an output signal of said second RS latch, and for supplying an output signal to an R input terminal of said first and second RS latches;

a fourth NAND gate for inputting an output signal of said first delaying element, an output signal of said first RS latch, and an output signal of said third NAND gate, and for supplying an output signal to an input terminal of the other side of said first NAND gate;

a fifth NAND gate for inputting an output signal of said second delaying element, an output signal of said second RS latch, and an output signal of said third NAND gate, and for supplying an output signal to an input terminal of the other side of said second NAND gate;

a first inverter for outputting an inverted signal of an output signal of said fourth NAND gate as said second phase lead detection signal; and a second inverter for outputting an inverted signal of an output signal of said fifth NAND gate as said second phase lag detection signal.

* * * * *